Sept. 10, 1968 D. R. CURRAN ET AL 3,401,283
PIEZOELECTRIC RESONATOR
Filed April 19, 1965 2 Sheets-Sheet 1

*INVENTORS*
DANIEL R. CURRAN
DONALD J. KONEVAL
BY
ATTORNEY

INVENTORS
DANIEL R. CURRAN
DONALD J. KONEVAL
BY
James A. Smith
ATTORNEY

United States Patent Office 3,401,283

Patented Sept. 10, 1968

3,401,283

PIEZOELECTRIC RESONATOR

Daniel R. Curran, Cleveland Heights, and Donald J. Koneval, Warrensville Heights, Ohio, assignors to Clevite Corporation, a corporation of Ohio Filed Apr. 19, 1965, Ser. No. 448,922
8 Claims. (Cl. 310—9.5)

ABSTRACT OF THE DISCLOSURE

A piezoelectric resonator is provided with dimensions and parameters in accordance with the following equation:

$$\frac{d}{t_w} \leq \frac{M}{n}\left(\frac{f_a}{f_b - f_a}\right)^{1/2}$$

where $d$ is the electrode diameter, $t_w$ is the wafer thickness, M is a constant, $n$ is the order of the harmonic overtone, $f_a$ is the resonant frequency of the electroded region of the wafer, $f_b$ is the resonant frequency of the surrounding non-electroded region of the wafer and the ratio $f_a/f_b$ is in the range of 0.8 to 0.99999. Reference is made to the claims for a legal definition of the invention.

This invention relates to piezoelectric resonators and, more particularly, to resonators having optimum motional characteristics.

The invention has utility in connection with piezoelectric resonators comprising a thin wafer of monocrystalline or ceramic material having a vibrational mode producing a particle displacement in the center plane of the wafer which is anti-symmetrical about the center plane of the wafer. Such vibrational modes include the thickness shear, thickness twist and torsional modes all of which can be obtained with piezoelectric monocrystalline materials and in piezoelectric ceramic materials.

The typical wafer type of resonator of thickness ($t$) is provided with electrodes of predetermined area on opposite planar surfaces thereof to enable the resonator to be excited electromechanically in its principal vibratory mode. At the resonant condition maximum particle motion and wave amplitude occur.

The prior art relating to wafer type of resonators discloses certain criteria to be followed in the selection of electrode dimensions and wafer thicknesses. For example, in "Quartz AT-Type Filter Crystals for the Frequency Range 0.7 to 60 Mc.," Bechmann, Proceedings of the I.R.E., vol. 49, No. 2, pp. 523–524 (1961) and "Crystals for Filter Applications, Part 3," Bechmann, Frequency, vol. 1, No. 7, pp. 18–21 (1963) the following relationships between electrode diameter ($d$) and wafer thickness ($t_w$) is disclosed for the fundamental and third and fifth harmonic modes for the suppression of spurious (inharmonic overtone) responses:

$$n=1 \quad \frac{d}{t_w}<18$$

$$n=3 \quad \frac{d}{t_w}<10$$

$$n=5 \quad \frac{d}{t_w}<7.5$$

The above criteria requires the use of smaller diameter electrodes as the frequency is increased. However, this concept has limitations. Since the diameter is decreased with frequency the motional and static capacitance of the resonator also decreases. At higher frequencies the resulting small values of motional and static capacitance which can be obtained are far less than optimum for many applications. Additionally, the above criteria does not consider electrode thickness dimensions and the resulting variable mass loading effects which we have found to be an essential consideration.

In U.S. Patent No. 2,967,958 a simple mathematical relationship between electrode diameter and frequency is proposed which by considering the relationship between frequency and wafer thickness apparently results in maximum electrode diameters equal to 23 times the wafer thickness. The simple mathematical relationship disclosed is also generally impractical because it does not consider electrode thickness and resulting electrode mass loading. The electrode dimensions of typical prior art resonators result in mass loading of approximately 1.8 percent and 0.64 percent for fundamental and third harmonic mode operation, respectively. It can be shown theoretically that if the criteria disclosed in Patent No. 2,967,958 were utilized to determine the maximum electrode diameter of a resonator having these mass loading characteristics spurious responses would result. Specifically, the fundamental mode resonator would have strong second inharmonic overtone responses; and the third harmonic mode resonator would have strong second inharmonic responses and also a possible weak fourth inharmonic mode response.

In copending application Ser. No. 281,488 filed on May 20, 1963, by William Shockley and Daniel R. Curran and also assigned to the same assignee as the present invention there is disclosed resonator structures in which wave propagation beyond the electroded region is minimized to thereby reduce the "range of action" and maximize the mechanical Q. This is accomplished by structurally establishing a relationship between the resonant frequency $f_a$ of the electroded region and the resonant frequency $f_b$ of the surrounding non-electroded region of the wafer whereby the frequency $f_b$ acts as a cut-off frequency for propagation of the vibratory mode from the electroded region. The relationship is preferably such that $f_a/f_b$ is in the range of 0.8 to 0.999, i.e., a value less than one, as disclosed in application Ser. No. 281,488. Utilizing the mass loading concept disclosed in application Ser. No. 281,488 we have formulated a relationship between electrode thickness and planar dimensions, wafer thickness, and frequency which makes feasible electrode diameters heretofore considered impractical.

It is, accordingly, a principal object of the present invention to provide a piezoelectric resonator free from spurious responses and having larger planar electrode dimensions for a given frequency than prior art resonators designed in accordance with the above criteria.

Another object of the present invention is to provide a piezoelectric resonator having a higher motional capacitance for a given frequency than prior art resonators.

Another object of the invention is to achieve a wider range of motional parameters in a piezoelectric resonator.

Another object of the invention is to provide a piezoelectric resonator having a maximum electrode diameter as high as 30 times the wafer thickness and spurious free response characteristics.

In general the invention contemplates a piezoelectric resonator provided with larger diameter electrodes than heretofore possible by establishing a particular relationship between the pimary mode resonant frequency and the resonant frequencies of one or more inharmonic overtone responses. The relationship between electrode diameter, wafer thickness and frequency utilizing the inventive concept is expressed by following equation:

$$\frac{d}{t_w} \leq \frac{M}{n}\left(\frac{fa}{f_b - f_a}\right)^{1/2}$$

where $d$ is the electrode diameter, $t_w$ is the wafer thickness, M is a constant, $n$ is the order of the harmonic overtone (1, 3, 5, etc.), $f_a$ is the resonant frequency of the electroded region of the wafer and $f_b$ is the resonant frequency of the surrounding non-electroded region of the wafer.

Other objects and advantages will become apparent from the following description taken in connection with the accompanying drawings wherein.

Figure 3A:
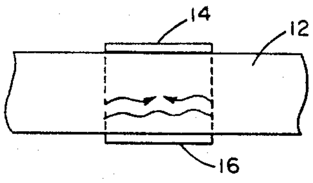
Figure 3B:
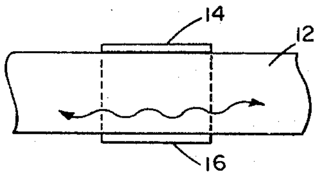
Figure 3C:
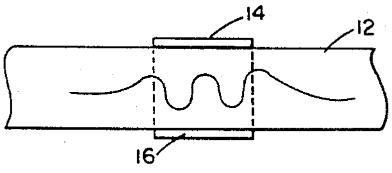
Figure 4:
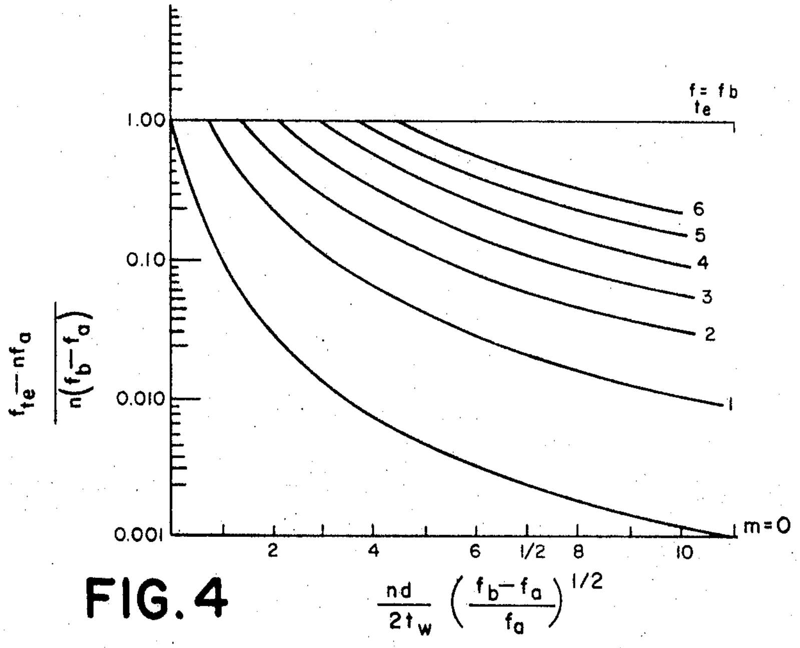
Figure 6:
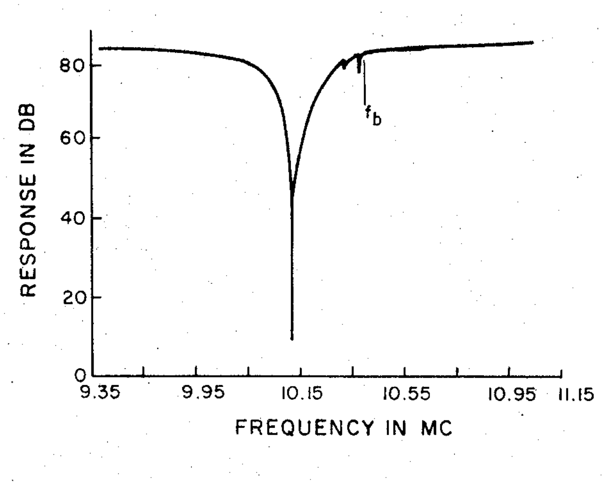
Figure 5:
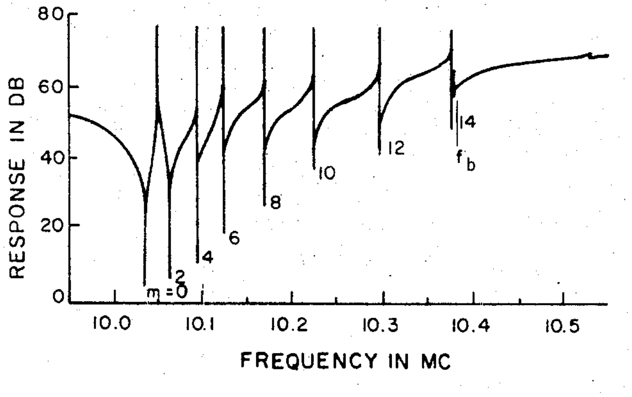

FIGURES 3*a*, 3*b*, and 3*c* are schematic illustrations indicating diagrammatically wave motion in a piezoelectric resonator during different conditions;

FIGURE 4 is a graph illustrating trapped energy mode eigenfrequencies for a harmonic and inharmonic series; and FIGURES 5 and 6 are frequency response curves illustrating the operating characteristics of a resonator constructed in accordance with the invention.

Figure 1:
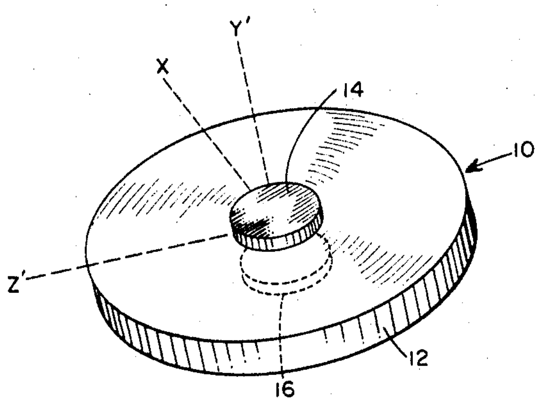
FIGURE 1 is a perspective view of a piezoelectric resonator.
Figure 2:
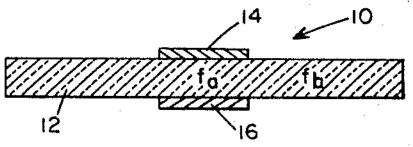
FIGURE 2 is a section taken along the line 2—2 of FIGURE 1.

Referring to FIGURES 1 and 2 of the drawings there is shown a schematic illustration of piezoelectric resonator which is identified generally by the reference numeral 10. The resonator comprises in general a wafer 12 of piezoelectric material having a pair of oppositely disposed electrodes 14 and 16 having leads 18 and 20 extending to the wafer edges. The electrodes 14, 16 and leads 18, 20 may be formed on the wafer surface by numerous techniques known in the prior art such as by vapor depositing an electrically conductive material on the wafer surface or by separately fabricating the electrode and lead parts from electrically conductive foil and then cementing the parts to the wafer surface.

Preferably the wafer 12 is formed from monocrystalline or ceramic material having a vibrational mode producing a particle displacement in the plane of the wafer which is anti-symmetrical about the center plane of the wafer, e.g., thickness shear, thickness twist and torsional modes.

Known monocrystalline piezoelectric materials include quartz, Rochelle salt, DKT (di-potassium tartrate), lithium sulfate or the like. As is well known to those skilled in the crystallographic arts, the basic vibrational mode of a crystal wafer is determined by the orientation of the wafer with respect to the crystallographic axis of the crystal from which it is cut. It is known for example that a "0° Z-cut" of DKT or an "AT-cut" of quartz may be used for a thickness shear mode of vibration.

Of the various monocrystalline piezoelectrics available quartz, primarily because of its stability and high mechanical quality factor $Q_m$ is a preferred material for narrow band filter applications. An "AT-cut" quartz wafer responds in the thickness shear mode to a potential gradient between its major surfaces and is particularly suitable.

For wider band filters the wafers are preferred fabricated of a suitable polarizable ferroelectric ceramic material such as barium titanate, lead zirconate-lead titanate, or various chemical modifications thereof. Suitable ceramic material for the purposes of the invention are ceramic compositions of the type disclosed and claimed in U.S. Patent No. 3,006,857 and the copending application of Frank Kulcsar and William R. Cook, Jr., Ser. No. 164,076, filed Jan. 3, 1962, and assigned to the same assignee as the present invention. Such ferroelectric ceramic compositions may be polarized by methods known to those skilled in the art. For example, a thickness shear mode of vibration may be accomplished through polarization in a direction parallel to the major surfaces of a wafer, in the manner described in U.S. Patent 2,646,610 to A. L. W. Williams.

While as discussed above, the inventive concept herein disclosed is equally applicable to monocrystalline or ceramic piezoelectric wafers having a vibrational mode wherein the particle motion is antisymmetrical with respect to the center plane, the disclosure will be in regard to resonators comprising an "AT-cut" quartz crystal.

In accordance with the theory disclosed in application Ser. No. 281,488 the resonator 10 is preferably dimensioned such that the electroded region (*a*) of the wafer 12 has a frequency $f_a$ which is less than the resonant frequency $f_b$ defined by the surrounding non-electroded region (*b*) of the wafer. The ratio $f_a/f_b$ is preferably in the range of 0.8 to 0.99999, i.e., a value less than one. With this relationship the non-electroded wafer region provides a cut-off frequency for propagation of a vibratory mode originating in the electroded region.

As disclosed in application Ser. No. 281,488 the frequencies $f_a$ and $f_b$ may be determined in accordance with the following equations in the case of simple resonator structures such as shown in FIGURES 1 and 2:

$$f_b=\frac{N_w}{t_w}$$

$$f_a=\frac{N_w}{t_w}\left[1+\frac{2\rho_e t_e}{\rho_w t_w}\right]^{-1}$$

where $N_w$ is the frequency constant of the wafer material, $\rho_w$ and $t_w$ are the respective density and thickness of the wafer, and $\rho_e$ and $t_e$ are the respective density and thickness of the electrodes.

*Energy trapping theory*

Consider now the theory underlying the present inventive concept, an electric field applied in the thickness direction of an ideal AT-cut quartz wafer will produce a thickness shear distortion with principal particle displacement in the crystallographic X direction indicated diagrammatically in FIGURE 1. Using Mindlin's notation as disclosed in "Strong Resonances of Rectangular AT-cut Quartz Plates," Mindlin and Gazis, Proceedings 4th U.S. National Congress of Applied Mechanics, pp. 305–310 (ASME 1962), and sinusoidal excitation, the resulting wave propagation in the X direction is called thickness shear $TS_1$, and in the crystallographic Z′ direction thickness twist $TT_3$. Further, the plane wave thickness shear resonance in the thickness or Y′ direction is a cut-off frequency for waves propagating in the plane of the wafer. Thickness shear and thickness twist waves with frequencies below cut-off cannot propagate in any direction in the plane of the wafer. The same situation also occurs in the fully electroded wafer depicted in FIGURES 1 and 2 except that the cut-off frequency $f_a$ is lower in value because of electrode mass-loading and a small electro-elastic effect. This results in energy trapping.

When electrodes 14 and 16 of finite thickness $t_e$ are applied to a limited portion of an AT-cut wafer, then separate cut-off frequencies exist for the electroded and surrounding regions (*a*) and (*b*). These cut-off frequencies, designated $f_a$ and $f_b$ respectively, divide the spectrum of interest into three ranges. Below $f_a$, $TT_3$ and $TS_1$ waves cannot propagate in either region. Between $f_a$ and $f_b$, waves can propagate in region (*a*) but not in region (*b*), and total internal reflection occurs at the boundary between the regions. This is illustrated in FIGURE 3(*a*). Above $f_b$ waves can propagate in both regions, FIGURE 3(*b*), so that vibratory energy generated in region (*a*) will propagate away and therefore cannot contribute to a localized standing wave response.

Excitation at frequencies between $f_a$ and $f_b$ will produce trapped waves in the Z region (*a*) which cannot escape into region (*b*). Because of boundary conditions, a portion of this vibratory energy fringes out into the cut-off region, but tails off exponentially with distance away from the electrode.

At specific excitation frequencies standing waves will occur in the region (*a*), resulting in a trapped energy mode response as indicated in FIGURE 3(*c*). The resonance or eigenfrequency of this response is dependent on the relative values of $f_a$ and $f_b$, and on the lateral dimensions of region ($a$). It is obvious that a whole series of such responses could occur. These are called the inharmonic overtone series; and the lowest of these is normally considered to be the fundamental thickness shear response of the resonator. It should be noted that the series ends at $f_b$, because at $f_b$ standing wave amplitudes approach zero as the waves escape into the region $f_b$.

Using an idealized two dimensional model, which among other things neglects effects of coupling to flexural or face shear modes depending on direction, an expression is derived for these eigenfrequencies as a function of $f_a$, $f_b$, variable electrode dimension ($d$), and wafer thickness $t_w$ for both fundamental and overtone modes.

*Inharmonic overtone series*

Consider an idealized two dimensional wafer of thickness $t_w$ in the Y′ direction and of infinite extent in the lateral Z′ direction. Solutions of the wave equation for particle displacement $u$ (in the X direction) for thickness twist modes propagating in the Z′ direction are of the form $$u=U \sin \eta Y' \exp. j(\zeta Z'-2\pi fT) \qquad (1)$$

where U is a constant and T is time. To satisfy the zero stress boundary condition at the major faces $$(\partial u/\partial Y'=0 \text{ at } Y'=\pm t_w/2)$$

displacement $u$ can have non-vanishing solutions only for $$\eta=n\pi/t_w \qquad (2)$$

where $n=1, 3, 5, \ldots$, is the order of the harmonic overtone, e.g., fundamental, 3rd harmonic, 5th harmonic, etc. Substitution of Equation 1 into the wave equation $$\frac{\partial^2 u}{\partial Y'^2}+\frac{\partial^2 u}{\partial Z'^2}=\frac{1}{v^2}\frac{\partial^2 u}{\partial T^2} \qquad (3)$$

gives the expression relating the propagation constants $$\eta^2+\zeta^2=(2\pi f/v)^2 \qquad (4)$$

and with Equation 2

$$\zeta=[(2\pi f/v)^2-(n\pi/t_w)^2]^{1/2} \qquad (5)$$

where $v=(\mu/\rho)^{1/2}$ is the velocity for propagation of shear waves, $\rho$ is the wafer density and $\mu$ is the shear modulus of elasticity for the wafer material.

Stress waves can propagate freely for all real values of $\zeta$, but reduce to non-propagating vibrations which decay exponentially with distance for imaginary values of $\zeta$. The frequency $f=nv/2t_w$, below which wave propagation cannot occur, is called the cut-off frequency, and is the thickness shear resonant frequency for plane waves in the Y′ direction. Referring again to FIGURE 2, the electroded region ($a$) and the unelectroded surrounding region ($b$) of the wafer will have cut-off frequencies which differ slightly because of the mass-loading and electroelastic effects of the electrodes. This effect can be approximated by postulating a slight difference in a material property such as density to give the observed difference in cut-off frequencies in two homogeneous regions of a wafer of uniform thickness. The cut-off frequencies for the fundamental mode propagation in the regions ($a$) and ($b$) respectively are given by $f_a=v_a/2t_w$ and $f_b=v_b/2t_w$. Cut-off frequencies for the $n$th harmonic mode are given in turn by $nf_a$ and $nf_b$. For each mode, resonant responses associated with limited electrode areas can only occur at frequencies between the mode's respective ($a$) and ($b$) cut-off frequencies. These mode resonant frequencies, or eigenfrequencies, can be determined by application of boundary conditions at the edges of the electroded region $Z'=\pm d/2$.

Solutions of the wave equation for the electroded and unelectroded regions are of the form of Equation 1. Continuity of particle displacement and shear stress across the interfaces at $Z'=\pm d/2$ impose 4 boundary conditions on these expressions. As a result, non-vanishing standing wave (resonant) solutions can occur only at specific frequencies between $f_a$ and $f_b$ which satisfy the following equation:

$$\operatorname{Tan} \zeta_a d/2=\gamma/\zeta_a \qquad (6)$$

where $$\zeta_a=\frac{\pi}{t_w}[(f/f_a)^2-n^2]^{1/2} \qquad (7)$$

and $$\gamma_b=-j\zeta_b=\frac{\pi}{t_w}[n^2-(f/f_b)^2]^{1/2} \qquad (8)$$

are obtained from Equation 5. Substitution of Equations 7 and 8 in Equation 6 yields:

$$\operatorname{Tan}\frac{\pi d}{2t_w}\left[\left(\frac{f}{f_a}\right)^2-n^2\right]^{1/2}=\frac{f_a}{f_b}\left[\frac{n^2f_b^2-f^2}{f^2-n^2f_a^2}\right]^{1/2} \qquad (9)$$

The solutions of this equation $f=f_{te}$, which are the eigenfrequencies of all non-vanishing mode resonances, can be expressed more conveniently as a fraction of the frequency lowering $$\psi\equiv\frac{f_{te}-nf_a}{n(f_b-f_a)} \qquad (10)$$

Noting that this expression is of the form tan $\alpha=\beta$ and can have one solution or many depending on the magnitude of $\alpha$, $\alpha=m\pi+\tan^{-1}\beta$, Equation 9 can be manipulated to obtain a useful expression relating mode frequencies with resonator parameters.

$$\frac{nd}{2t_w}=\frac{\Omega_0\left(m+\frac{1}{\pi}\tan^{-1}\theta\right)}{\{\psi(1-\Omega_0)[2\Omega_0+\psi(1-\Omega_0)]\}^{1/2}} \qquad (11)$$

where $$\theta^2\equiv\frac{(1-\psi)\Omega_0^2[1+\Omega_0+\psi(1-\Omega_0)]}{\psi[2\Omega_0+\psi(1-\Omega_0)]} \qquad (12)$$

and $$\Omega_0=f_a/f_b \qquad (13)$$

Here $n=1, 3, 5$, etc. is the order of the harmonic mode and $m=0, 1, 2, 3, 4$, etc. gives the inharmonic overtone mode series for each value of $n$. It should be noted that fundamental and basic harmonic mode series are given by $m=0$, $n=1, 3, 5$, etc.

The complete solution for the above relates the eigenfrequencies of all of the possible two dimensional $TT_3$ modes to the resonator parameters $d/t_w$ and $f_a/f_b$ and from this, the mode series for each harmonic ($n=1, 3, 5$, etc.) can be presented graphically in terms of these parameters. If however, these mode are plotted in normalized fashion as $$\psi_{nm}=\frac{f_{te}-nf_a}{n(f_b-f_a)} \qquad (14)$$

with $$\frac{nd}{2t_w}\left[\frac{f_b-f_a}{f_a}\right]^{1/2}$$

as the resonator variable, then the series is presented graphically in the simple fashion of FIGURE 4. It should be noted that Equation 11 and FIGURE 4 can also be applied to the thickness shear $TS_1$ modes in the X direction as an approximation, by assuming that coupling between $TS_1$ and the $F_1$ flexure modes is negligible. This was found to be a reasonable approximation in practice.

On the basis of these results, criteria for the suppression of a portion or all of each inharmonic overtone series can be obtained from Equation 11 or FIGURE 4. This is justified by the following derivation and has been verified experimentally.

*Trapped energy modes*

An electroded area of limited extent on an infinite quartz wafer, or even on a finite wafer which in turn is mounted on low Q supports, can have a high mode $Q_m$ and a substantial resonant response only if a very large fraction of its vibratory energy is restricted to the region in and around its electrodes. For either type of wafer, vibratory energy which propagates to other portions of the wafer is not usually available to the electroded region in coherent form and therefore is in effect dissipated. The application of energy trapping to the case at hand to explain the generation or suppression of specific modes can be considered for the idealized two dimensional wafer in terms of a single internal reflection.

Consider the internal reflection of an incident thickness-twist wave at the boundary of the electroded region. If the reflected wave is equal to amplitude to the incident wave, then in the usual case total internal reflection occurs and energy has not been lost to a refracted wave. Assuming this occurs at each of the edges of the electrode, then the resulting mode, whether fundamental or inharmonic overtone, will have a strong response and a high Q. On the other hand, if the reflected wave amplitude is less than unity, then the response of the resultant mode must be relatively weak and have a low Q.

Wave amplitudes A and B for incident and reflected waves respectively can be obtained on the above mentioned basis for an internally incident thickness twist wave using wave functions in the convenient exponential form $$u_a=[\underset{\text{(incident)}}{A_a \exp.(j\zeta_a Z')}+\underset{\text{(reflected)}}{B_a \exp.(-j\zeta_a Z')}]\sin(\eta Y')\exp.(-j2\pi fT) \quad (15)$$

$$u_b=A_b \sin(\eta Y')\exp.(-j2\pi fT+j\zeta_b Z') \quad (16)$$

where subletters *a* and *b* refer to electroded and surrounding regions of the wafer. The usual boundary conditions of continuity of stress and displacement at the electrode edge $Z=d/2$ (assumption of symmetry about $Z'=0$, giving electrode width of $d$, is convenient for use with previously mentioned mode-frequency curves) gives $$A_a \exp.(j\zeta_a d/2)+B_a \exp.(-j\zeta_a d/2)=A_b \exp.(j\zeta_b d/2) \quad (17)$$

and $$\zeta_a[A_a \exp.(j\zeta_a d/2)-B_a \exp.(-j\zeta_a d/2)]=\zeta_b A_b \exp.(j\zeta_b a/2) \quad (18)$$

Values of the desired ratio $B_a/A_a$ can be calculated as a function of frequency, if values of $\zeta_a$ and $\zeta_b$ are substituted in Equations 17 and 18. However, conclusions can be drawn from the form of the resulting $B_a/A_b$ equation, the knowledge of the frequency regions in which $\zeta_a$ and $\zeta_b$ are real and imaginary, and the relative magnitudes of these propogation constants.

For $f_a<f_b<f$, both $\zeta_a$ and $\zeta_b$ are real and $\zeta_a<\zeta_b$ as can be seen from Equations 7 and 8. This gives $$\frac{B_a}{A_a}=\frac{\zeta_a-\zeta_b}{\zeta_a+\zeta_b}\exp.(j\zeta_a d) \quad (19)$$

and $$\left|\frac{B_a}{A_a}\right|<1 \quad (20)$$

For $f_a<f<f_b$, $\zeta_a$ is real and $\zeta_b=j\gamma_b$ is imaginary. Then $$B_a/A_a=\exp.2j(\zeta_a d/2-\phi) \quad (21)$$

where $\phi=\tan^{-1}\gamma_b/\zeta_a$, and $$\left|\frac{B_a}{A_a}\right|=1 \quad (22)$$

For $f<f_a<f_b$, both $\zeta_a$ and $\zeta_b$ are imaginary with $\zeta_a<\zeta_b$, giving $$\frac{B_a}{A_a}=-\frac{\gamma_b-\gamma_a}{\gamma_b+\gamma_a}\exp.(-\gamma_a d) \quad (23)$$

and $$\left|\frac{B_a}{A_a}\right|<1 \quad (24)$$

From Equations 20, 22 and 24 it can be concluded that modes of vibration associated principally with the electroded region can have strong responses and high Q's only when their mode resonant frequency $f_{te}$ falls between $f_a$ and $f_b$. In this case total internal reflection occurs. In addition to the fundamental or harmonic trapped energy modes, which obviously satisfy this condition, one or more inharmonic overtone modes as plotted in FIGURE 4 could also have their mode resonance $f_{te}$ fall below $f_b$. These inharmonics, if unwanted, would usually be called spurious responses. Referring again to FIGURE 4, the modes which can be excited for any set of resonator parameters can be identified, as can the conditions for which any group of inharmonics will be suppressed, i.e., when their eigenfrequencies are equal to or greater than $f_b$. Resonator parameters $d/t_w$ and $f_a/f_b$ for the suppression of the $m$th and all higher inharmonic modes are given by $$\frac{d}{t_w}\leq\frac{M_m}{n}\left[\frac{f_a}{f_b-f_a}\right]^{1/2} \quad (25)$$

where the parameter $M_m$ has theoretical values as follows:

| | |
|---|---|
| $m=1$, | $M_m=1.41$ |
| $m=2$, | $M_m=2.83$ |
| $m=3$, | $M_m=4.24$ |
| $m=4$, | $M_m=5.66$ |
| $m=5$, | $M_m=7.07$ |
| $m=6$, | $M_m=8.48$ |

etc.

If the 1st inharmonic mode is not excited because of symmetry conditions, then Equation 25 can be used as a design criterion for the suppression of all remaining inharmonic modes, by setting $M=2.83$. This in effect gives a design criterion which includes both electrode dimension and electrode mass loading (dependent on electrode thickness) for the fundamental and also harmonic overtone modes for either the Z' or X directions. This can be considered to specify electrode diameter in the case of circular electrodes and to be a generalized criterion for the suppression of inharmonic overtone modes.

*Experimental verifications of inharmonic overtone series*

The principal verifications of the theory herein disclosed has been in inharmonic mode frequency measurements at the fundamental, 3rd, and 5th harmonic modes at 10, 30 and 50 mc. for both the $TS_1$ and $TT_3$ modes. These data were obtained using long narrow rectangular electrodes, as an approach to a two dimensional configuration, In each case the electrode was oriented in the appropriate crystallographic direction, X for $TS_1$ and Z' for $TT_3$, and half lattice bridge response curves were plotted for each value of electrode length as electrode length was reduced stepwise by photoetching. Photoetching techniques were used so that electrode thickness and bond characteristics could both remain invariant. Initial electrode dimensions for the fundamental, 3rd and 5th harmonic modes respectively were $100t_w$ by $10t_w$, $56t_w$ by $5.3t_w$ and $29t_w$ by $2.3t_w$.

A classic example of these measurements is shown by the response curves illustrated in FIGURES 5 and 6 for a fundamental mode unit with substantial mass loading ($f_a/f_b=0.966$) and electrode length $100t_w$ in the X direction. The numbered responses are the inharmonic overtone series with $m=0$ as the fundamental thickness shear response. In FIGURE 5 inharmonic overtones through the 14th are identified. In each instance, as the electrode length was reduced, the whole inharmonic overtone series was shifted up in frequency toward the cut-off $f_b$. As each response approached $f_b$ it decreased in amplitude and then vanished. Finally, only the fundamental response ($m=0$) was left as shown in FIGURE 6.

Eigenfrequencies for the inharmonic modes for each experiment in the X and Z′ direction were recorded and compared with the theoretical mode frequency values given by FIGURE 4. This was done for the 6 series of experiments, i.e., X and Z′ orientation for the fundamental, 3rd, and 5th harmonic modes. In all of these good agreement was observed between theory and experiment.

The experiments described served not only to verify the theory herein disclosed but also to improve on theory by obtaining design criteria with greater accuracy. If 1st inharmonic modes are avoided with symmetric excitation (symmetrical arrangement of electrodes and leads) a generalized design criterion of the form of Equation 25 for filter crystals without inharmonic overtone responses can be written with both theoretical and the more accurate empirical values of M. Again, $d/t_w$ is the electrode dimension in wafer thickness.

$$\frac{d}{t_w} \leq \frac{M}{n}\left[\frac{f_a}{f_b - f_a}\right]^{1/2} \qquad (26)$$

where appropriate values of M are given by the following table:

| n | M (Empirical) X | M (Empirical) Z′ | M (Theoretical) X | M (Theoretical) Z′ |
|---|---|---|---|---|
| 1 | 2.8 | 2.4 | 2.83 | 2.83 |
| 3 | 2.4 | 2.4 | 2.83 | 2.83 |
| 5 | 2.6 | 2.4 | 2.83 | 2.83 |

From these criteria it is evident that electrode dimension and mass loading can be traded off against one another to a considerable extent to obtain desired results, e.g., a wider range of motional parameters. This has been demonstrated with excellent results for both fundamental and harmonic overtone modes resonators.

In accordance with the invention the following maximum values of $d/t_w$ are practical for the fundamental, 3rd, 5th, 7th and 9th harmonic modes in the case of wafers fabricated using standard techniques:

| n | $d/t_w$ |
|---|---|
| 1 | 30 |
| 3 | 30 |
| 5 | 25 |
| 7 | 25 |
| 9 | 20 |

The maximum values of $d/t_w$ indicated above would be much higher in the case of an ideal wafer having perfectly flat parallel face surfaces. Accordingly, it will be apparent that the values of $d/t_w$ can be increased by specialized fabrication techniques resulting in smaller dimensional variations.

The following table is a comparison of characteristics of a prior art 50 mc. fifth harmonic mode AT-cut quartz resonator and a 50 mc. fifth harmonic mode AT-cut quartz resonator in accordance with the invention:

| | Prior art resonator | Resonator in accordance with the invention |
|---|---|---|
| Electrode diameter (d) ($t_w$) | 7.5 | 15.2 |
| Motional capacitance $C_1$ (high value desired) (pf) | $0.72\times10^{-4}$ | $1.82\times10^{-4}$ |
| Resonant resistance (low value desired), ohms | 350 | 84 |
| Static to motional capacitance ratio $C_0/C_1$ (low value desired) | 25,000 | 5,400 |
| $Q_m$ (high value desired) | 125,000 | 129,000 |

The characteristics listed clearly indicate the marked improvement in motional and other parameters achieved by the present invention.

While there have been described what at present are believed to be the preferred embodiments of this invention, it will be obvious to those skilled in the art that various changes and modifications may be made therein without departing from the invention, and it is aimed, therefore, to cover in the appended claims all such changes and modifications as fall within the true spirit and scope of the invention.

It is claimed and described to secure by Letters Patent of the United States:

1. In a piezoelectric resonator, the combination comprising: a wafer of piezoelectric material defining a center plane and having a vibrational mode producing a particle displacement which is antisymmetrical about said center plane; and a pair of spaced electrodes on said wafer having a variable planar dimension ($d$) and defining an electroded region having a resonant frequency $f_a$; said wafer defining a non-electroded region surrounding said electroded region of thickness $t_w$ having a resonant frequency $f_b$; the electrode dimension ($d$), frequencies $f_a$ and $f_b$, and thickness $t_w$ being related by the following equation:

$$\frac{d}{t_w} \leq \frac{M}{n}\left(\frac{f_a}{f_b - f_a}\right)^{1/2}$$

where M is a constant, $n$ is the digit representative of the fundamental mode or a harmonic overtone and the ratio of $f_a/f_b$ is substantially in the range of 0.999 to 0.99999.

2. In a piezoelectric resonator, the combination comprising: a wafer of piezoelectric material defining a center plane and having a vibrational mode producing a particle displacement which is antisymmetrical about said center plane; a pair of circular aligned electrodes having a diameter ($d$) on opposite face surfaces of said wafer respectively defining an electroded region having a resonant frequency $f_a$; said wafer defining a non-electroded region surrounding said electroded region of thickness $t_w$ having a resonant frequency $f_b$; the electrode diameter ($d$), frequencies $f_a$ and $f_b$, and thickness $t_w$ being related by the following equation:

$$\frac{d}{t_w} \leq \frac{M}{n}\left(\frac{f_a}{f_b - f_a}\right)^{1/2}$$

where M is a constant, $n$ is the digit representative of the fundamental mode or a harmonic overtone and the ratio of $f_a/f_b$ is substantially in the range of 0.999 to 0.99999.

3. In a piezoelectric resonator as claimed in claim 2 wherein said wafer has a thickness shear mode of vibration.

4. In a piezoelectric resonator as claimed in claim 3 wherein M has a constant value for the fundamental mode and each harmonic overtone from 2.4 to 2.8.

5. In a piezoelectric resonator as claimed in claim 4 wherein said wafer is fabricated from piezoelectric ceramic material.

6. In a piezoelectric resonator as claimed in claim 4 wherein said resonator is fabricated from quartz material.

7. In a piezoelectric resonator the combination comprising: a wafer of piezoelectric material defining a center plane and having a vibrational mode producing a particle displacement which is antisymmetrical about said center plane; a pair of spaced electrodes on said wafer having a variable planar dimension ($d$) and defining an electroded region having a resonant frequency $f_a$; said wafer defining a non-electroded region surrounding said electroded region of thickness $t_w$ having a resonant frequency $f_b$; the ratio $f_a/f_b$ having a maximum value of 0.99999 and the ratio $d/t_w$ having a maximum value $f_a$; said wafer defining a non-electroded region surround-selected from the following table where $n$ is the digit representative of the fundamental mode or a harmonic overtone:

| $n$ | $d/t_w$ |
|---|---|
| 1 | 30 |
| 3 | 30 |
| 5 | 25 |
| 7 | 25 |
| 9 | 20 |

8. In a piezoelectric resonator, the combination comprising: a wafer of piezoelectric material defining a center plane and having a vibrational mode producing a particle displacement which is antisymmetrical about said center plane; and a pair of spaced electrodes on said wafer having a variable planar dimension ($d$) and defining an electroded region having a resonant frequency ing said electroded region of thickness $t_w$ having a resonant frequency $f_b$; the electrode dimension ($d$), frequencies $f_a$ and $f_b$, and thickness $t_w$ being related by the following equation:

$$\frac{d}{t_w} \leq \frac{M}{n}\left(\frac{f_a}{f_b - f_a}\right)^{1/2}$$

where M is a constant, $n$ is the digit representative of the fundamental mode or a harmonic overtone and the ratio of $f_a/f_b$ is between 0.999 and 0.99999.

References Cited

UNITED STATES PATENTS

| | | | |
|---|---|---|---|
| 3,020,424 | 2/1962 | Bechmann | 310—9.5 |
| 2,967,958 | 1/1961 | Kosowsky | 310—9.5 |
| 3,336,487 | 8/1967 | Martyn | 310—9.5 |

J. D. MILLER, *Primary Examiner.*